United States Patent

Balakrishnan

[11] Patent Number: 5,469,334
[45] Date of Patent: Nov. 21, 1995

[54] PLASTIC QUAD-PACKAGED SWITCHED-MODE INTEGRATED CIRCUIT WITH INTEGRATED TRANSFORMER WINDINGS AND MOULDINGS FOR TRANSFORMER CORE PIECES

[75] Inventor: Balu Balakrishnan, Saratoga, Calif.

[73] Assignee: Power Integrations, Inc., Sunnyvale, Calif.

[21] Appl. No.: 64,860

[22] Filed: May 20, 1993

Related U.S. Application Data

[60] Continuation-in-part of Ser. No. 924,106, Aug. 3, 1992, abandoned, which is a division of Ser. No. 756,487, Sep. 9, 1991, Pat. No. 5,161,098.

[51] Int. Cl.$^6$ .................... H05K 7/02; H02J 17/00; H01F 5/04
[52] U.S. Cl. ............... 361/782; 174/52.4; 257/786; 257/924; 307/150; 333/185; 336/82; 336/83; 336/98; 336/200; 336/145; 336/182; 336/225; 336/223; 365/226; 365/229
[58] Field of Search ................ 336/83, 96, 200, 336/232, 65, 82, 83, 90, 92, 98, 206, 208, 212, 221, 223, 226, 199, 145, 146, 147, 148, 175, 180, 182, 185, 220, 225, 205, 223; 361/782, 820, 821, 765, 777.1, 782, 783, 811, 820, 821, 777; 174/52.1, 52.4; 257/924, 786, 924; 333/172, 177, 182, 184, 185; 307/64, 65, 150; 365/226, 229

[56] References Cited

U.S. PATENT DOCUMENTS

| | | | |
|---|---|---|---|
| 3,185,947 | 5/1965 | Freymodsson | 361/765 |
| 4,381,458 | 4/1983 | Anstey et al. | 307/150 |
| 4,455,545 | 6/1984 | Shelly | 336/200 |
| 4,622,627 | 11/1986 | Rodriguez et al. | 361/765 |
| 4,645,943 | 2/1987 | Smith, Jr. et al. | 307/150 |
| 4,777,465 | 10/1988 | Meinel | 336/223 |

(List continued on next page.)

FOREIGN PATENT DOCUMENTS

| | | | |
|---|---|---|---|
| 0126169 | 11/1984 | European Pat. Off. | 336/200 |
| 59-191367 | 10/1984 | Japan | 257/924 |
| 4-27208 | 1/1992 | Japan | 333/185 |
| 4-127510 | 4/1992 | Japan | 336/200 |
| 5-291062 | 11/1993 | Japan | 336/200 |
| 6-36946 | 2/1994 | Japan | 336/205 |
| 6-53045 | 2/1994 | Japan | 336/200 |
| 6-151178 | 5/1994 | Japan | 336/200 |
| 6-151179 | 5/1994 | Japan | 336/200 |
| 6-176937 | 6/1994 | Japan | 336/200 |
| 6-163266 | 10/1994 | Japan | 336/200 |

OTHER PUBLICATIONS

Article from Machine Design, vol. 62, No. 9, May 10, 1990 "IC Forms Compact Isolated Power Supply".
IBM Technical Disclosure Bulletin, vol. 28 Feb. 1986, "Method of Forming a High Frequency Transformer".

*Primary Examiner*—Donald A. Sparks
*Attorney, Agent, or Firm*—Law Offices of Thomas E. Schatzel

[57] ABSTRACT

A switching power supply embodiment of the present invention includes a plastic leaded chip carrier (PLCC) that has two rectangular holes joined by a channel on the bottom surface that allow the PLCC to be surface mounted on a printed circuit board over a ferrite U-core section. A ferrite I-core section caps the ends of the U-core section above the top surface of the PLCC. A wire frame within the PLCC provides for several individual parallel conductor segments that pass between the two holes to rows of surface mount pins on opposite edges of the PLCC. Traces on the printed circuit board complete the connection of these conductor segments to form a primary winding of a transformer. A secondary winding is similarly constructed using pins on another edge of the PLCC. A switched mode power supply integrated circuit chip is molded directly into the body of the PLCC nearer the primary winding conductor and chops current flowing in the primary winding according to a voltage derived from the current that results in the secondary winding.

11 Claims, 6 Drawing Sheets

U.S. PATENT DOCUMENTS

| | | | |
|---|---|---|---|
| 4,780,795 | 10/1988 | Meinel | 361/765 |
| 4,873,757 | 10/1990 | Williams | 29/602.1 |
| 4,975,671 | 12/1990 | Dirks | 336/65 |
| 5,014,026 | 5/1991 | Wanjura | 333/185 |
| 5,243,308 | 9/1993 | Shusterman et al. | 333/185 |
| 5,345,670 | 9/1994 | Pitzele et al. | 336/223 |
| 5,353,001 | 10/1994 | Meinel et al. | 336/83 |

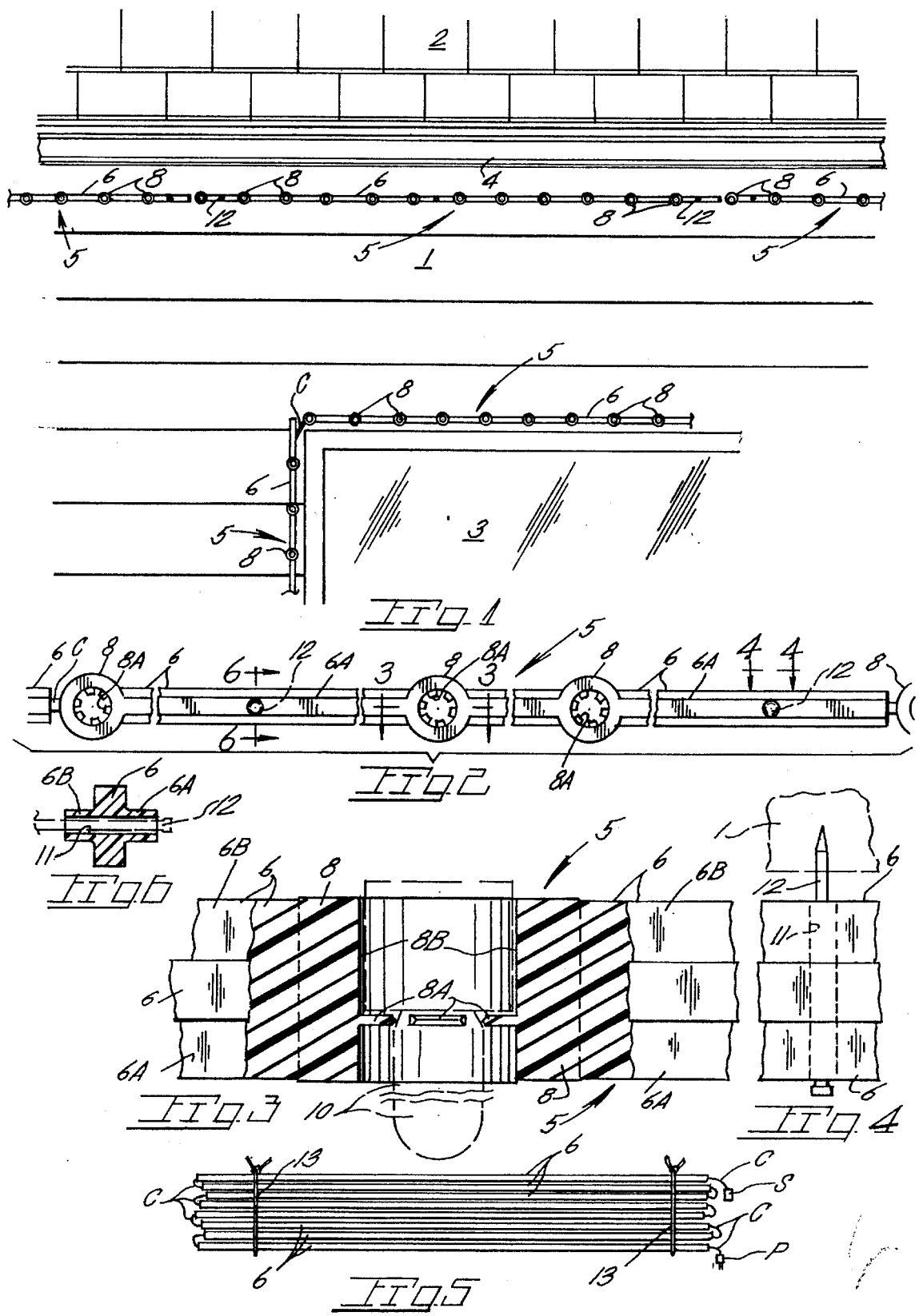

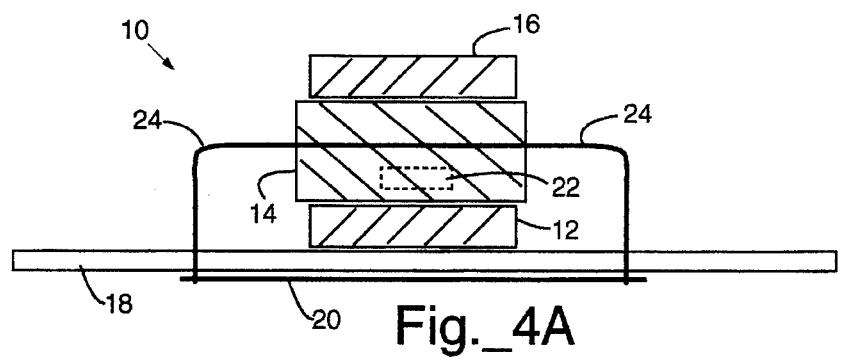
Fig._4A
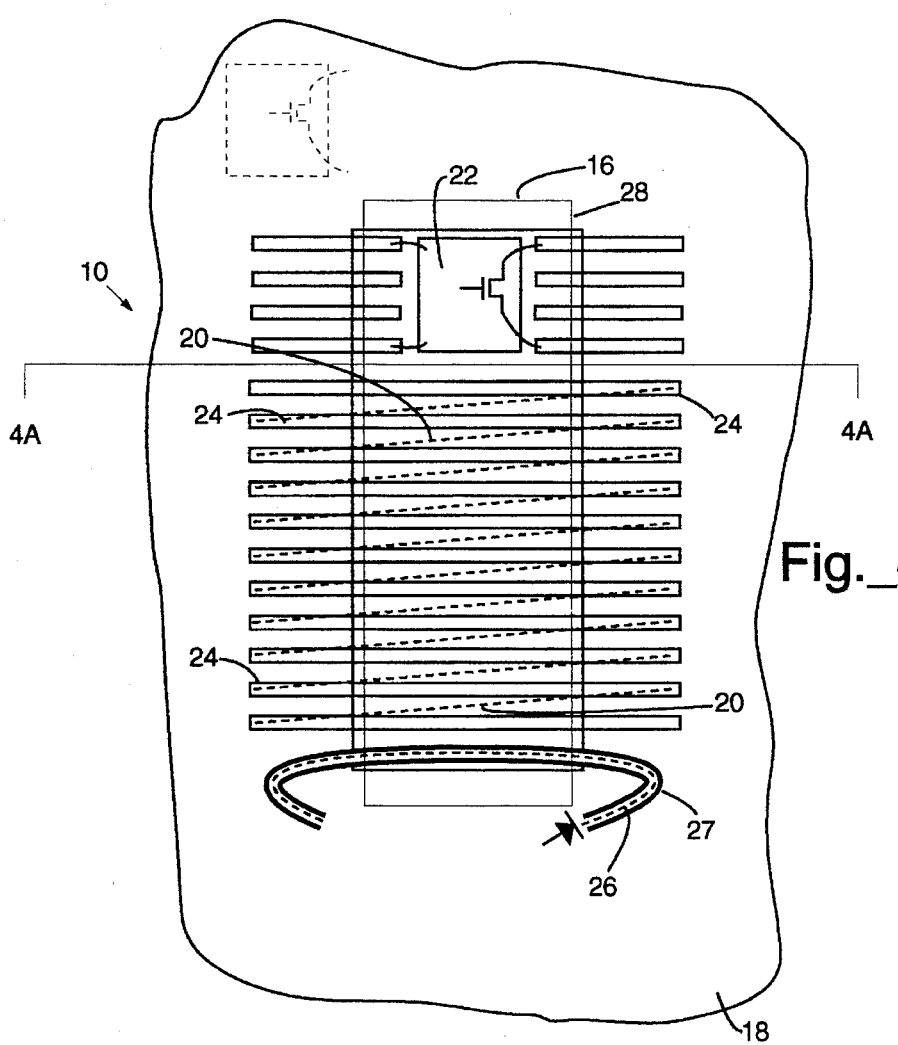
Fig._4B
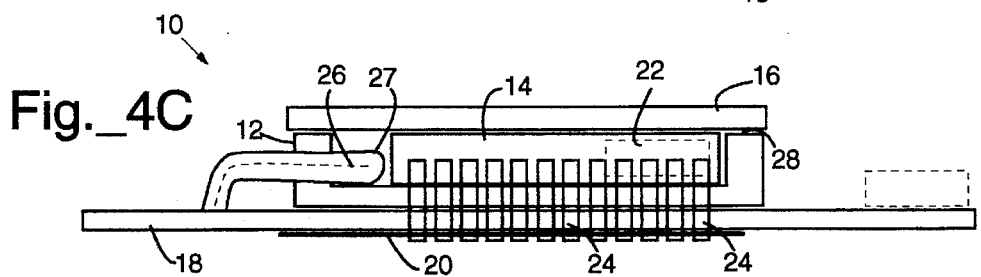
Fig._4C

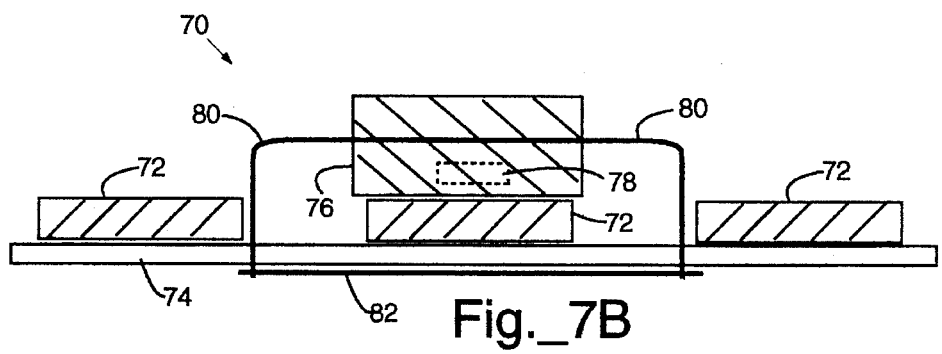
Fig._7B
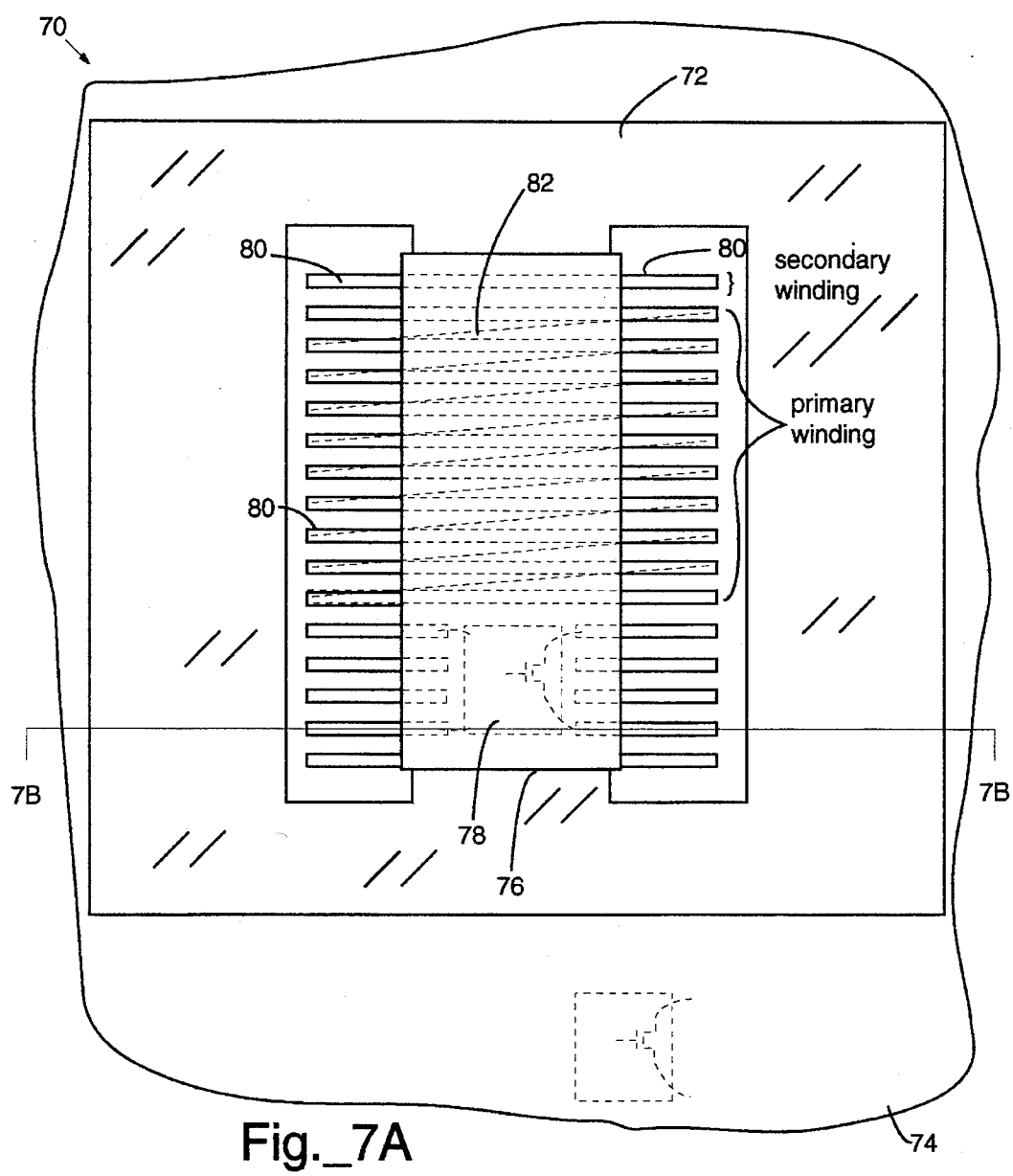
Fig._7A

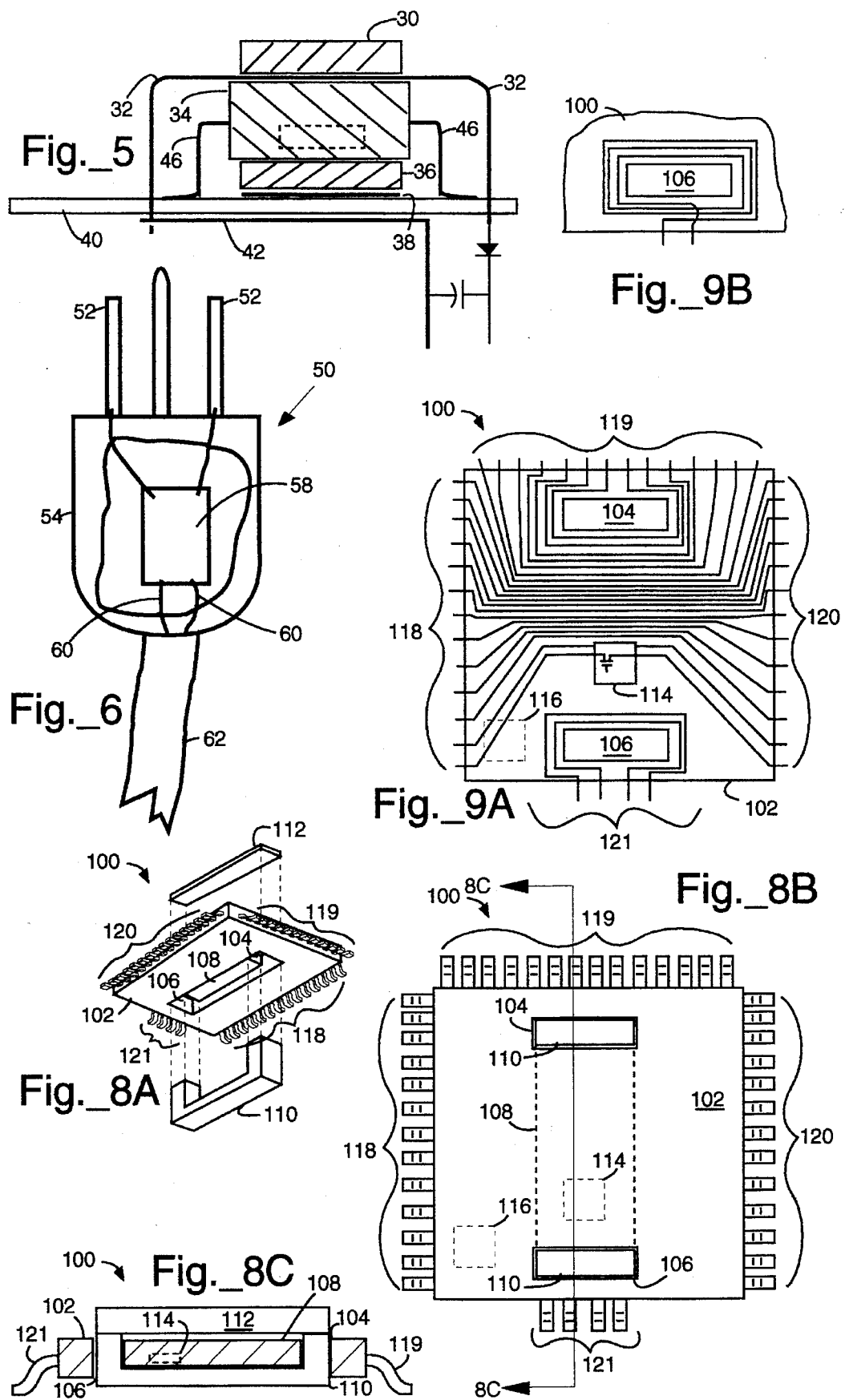

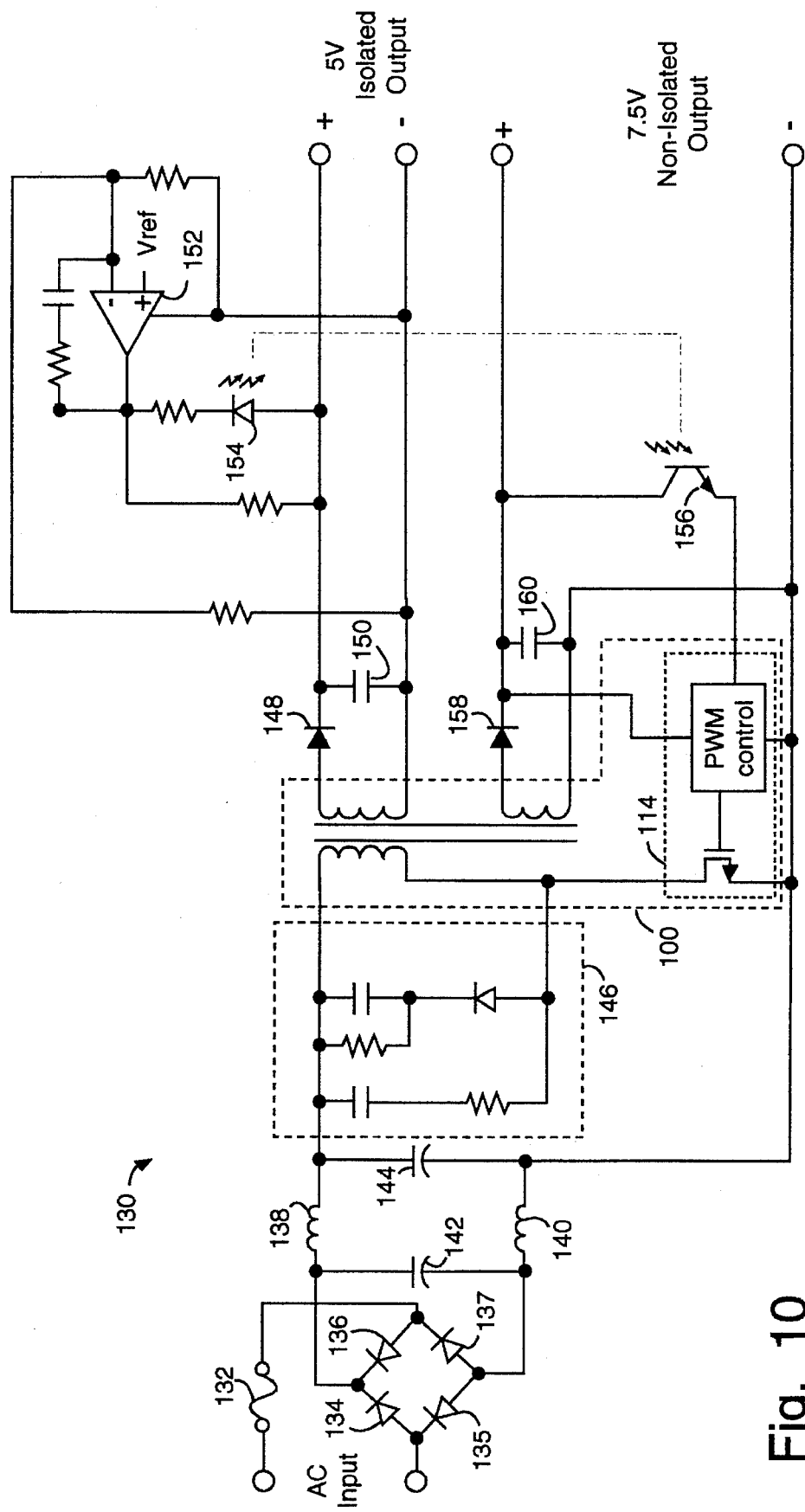
Fig._10

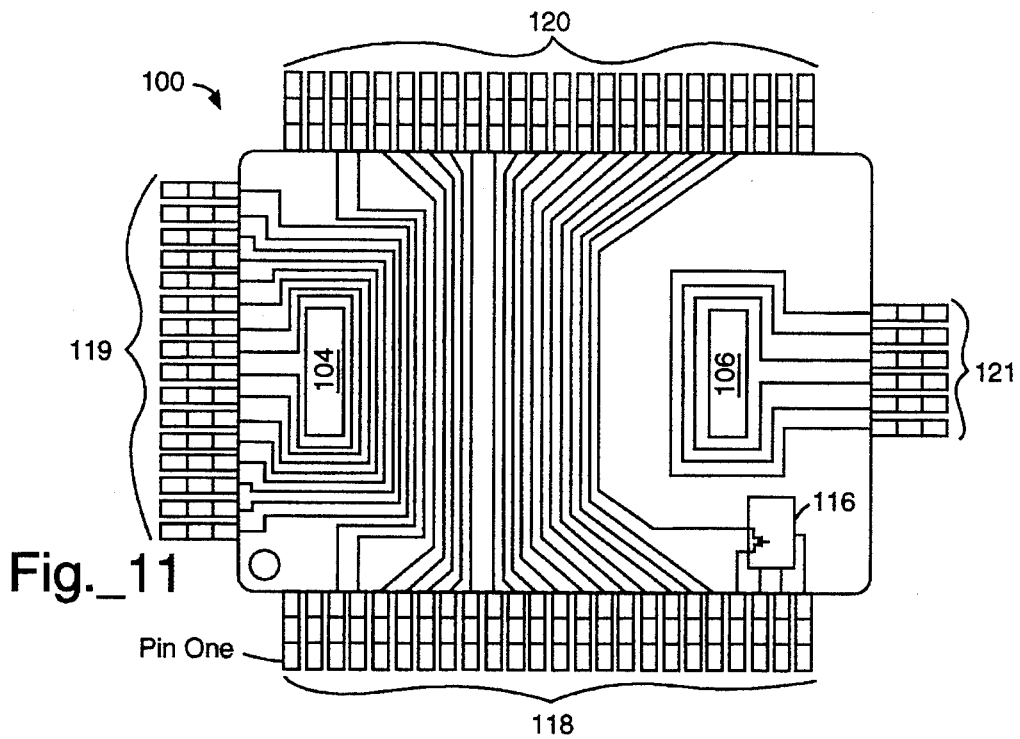
Fig._11
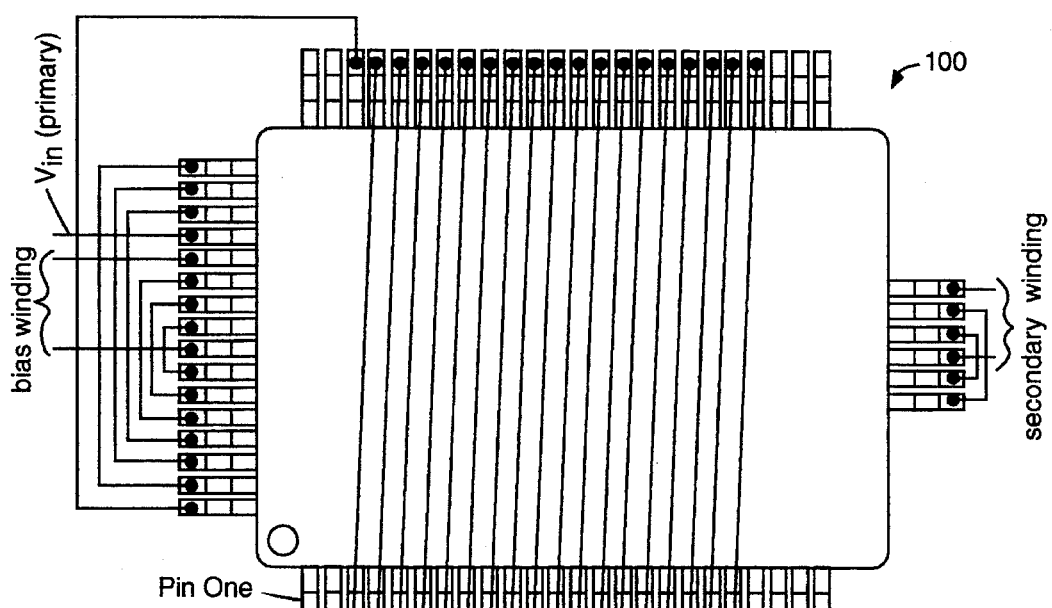
Fig._12

PLASTIC QUAD-PACKAGED SWITCHED-MODE INTEGRATED CIRCUIT WITH INTEGRATED TRANSFORMER WINDINGS AND MOULDINGS FOR TRANSFORMER CORE PIECES

RELATED APPLICATIONS

This Application is a continuation-in-part of application Ser. No. 07/924,106, filed Aug. 3, 1992 abandoned which itself was a divisional of an application issued Nov. 3, 1992, as U.S. Pat. No. 5,161,098, and which had been filed Sep. 9, 1991 as Ser. No. 756,487.

BACKGROUND OF THE INVENTION

1. Field of the Invention

The present invention relates to switching power supplies, or power converters, and more particularly to small, low cost switching power converters whose structural configuration permits automated assembly and elimination of a conventional transformer.

2. Description of the Prior Art

The consumer electronics revolution has resulted in a wide array of small, highly portable devices that typically run on batteries. For example, small Japanese televisions, radios, and CD players almost universally are supplied in the United States with earphones for private listening and AC power adaptors to save battery drain. If the device does not come with an AC adaptor, one is usually easily available, either from the original manufacturer or an after market supplier.

Two basic kinds of AC adaptors are ubiquitous, the linear type and the switching type. The linear type uses large 60 Hz transformers. FIG. 1 is a schematic of a typical prior art linear type AC adaptor which incorporates a 60 Hz transformer. The switching type uses a circuit to chop incoming power into high frequency pulses and can use very small and light transformers. FIG. 2 is a schematic of a relatively expensive prior art switching type power supply which feeds back voltage, current and/or power, in a closed loop control circuit, to regulate its output. Below ten watts, it has been more cost effective for manufacturers to supply the linear type AC adaptor, even though the 60 Hz step-down transformers can get quite bulky. At about ten watts, a cost-to-produce cross-over point is reached, and the more sophisticated switching type AC adaptors become cost effective. When switching type AC adaptors are used, the consumer benefits from the reduced size and weight of the unit that must be plugged into a wall plug.

Cost is a critical factor in being able to compete in the consumer electronics market. High performance is often not as important to consumers as low purchase cost. So manufacturers often choose to supply large and bulky 60 Hz transformers in plastic housings resembling bricks for their designs, even though smaller, lighter weight and more efficient designs are possible using switching power converters. One reason the linear type AC adaptor has a lower production cost is that the transformers used in switching type AC adaptors are difficult to assemble with automated equipment. Manual labor must be employed, and that lowers volumes and increases the per unit cost. Very often, the labor component in manufacturing costs is the biggest expense in producing power supplies under two watts.

Prior art linear type AC adaptors have efficiencies that reach only as high as fifty to sixty percent. A lot of power gets thrown-off as heat. These low efficiencies limit the power range of this type of power supply because the waste heat may make the unit too hot to handle, or dangerous to operate in certain situations.

Thus the prior art forces the designer or manufacturer of consumer electronic equipment to be faced with a choice between a heavy, large and inefficient linear power supply (which has a 60 Hz transformer) but which is inexpensive to produce, or a relatively light-weight, small-sized and very efficient switched mode power supply that is expensive to produce. Generally, the choice is made in favor of the lower cost, large, heavy and inefficient power supply.

Randolph Shelly describes in U.S. Pat. No. 4,455,545, issued Jun. 19, 1984, an output inductor for high frequency inverter power supplies. A pair of channel-shaped ferrite core members are assembled with a gap of material approximating the permeability of air. The core members are arranged to provide an axial aperture in between. A plurality of conductor segments are positioned within the aperture and are electrically interconnected to plated through holes in a supporting printing circuit board assembly. The conductor turns for the inductor are selected for the inductor by the pattern of the printed circuit interconnections between selected plated-through holes.

K. B. A. Williams describes in U.S. Pat. No. 4,873,757, issued Oct. 17, 1989, a ferrite and thus permit magnetic induction and transformer action via the ferrite core.

Wolfgang Dirks describes in U.S. Pat. No. 4,975,671, issued Dec. 4, 1990, a multi-component transformer for use in conjunction with surface mount technology. Transformer windings are provided by a plurality of conductors arranged in parallel and disposed around a ferrite core. Another part of the windings is disposed in a spacer member or in tracings on a printed circuit card. A continuous loop of ferrite material is placed inside the windings.

Therefore a need exists for an AC adaptor technology that can provide the performance advantages of a switching type power supply, such as high efficiency, small size and light weight, while also providing the cost advantages of the sixty hertz transformer type power supplies. The present invention solves the problem of the expense of manufacturing a switching type power transformer by a novel method described below in detail.

SUMMARY OF THE PRESENT INVENTION

It is therefore an object of the present invention to provide a switching power supply that integrates both the primary and secondary windings of a switching transformer with a corresponding switching power supply control chip.

Briefly, a switching power supply embodiment of the present invention includes a plastic leaded chip carrier (PLCC) that has two rectangular holes joined by a channel on the bottom surface that allow the PLCC to be surface mounted on a printed circuit board over a ferrite U-core section. A ferrite I-core section caps the ends of the U-core section above the top surface of the PLCC. A wire frame within the PLCC provides for several individual parallel conductor segments that pass between the two holes to rows of surface mount pins on opposite edges of the PLCC. Traces on the printed circuit board complete the connection of these conductor segments to form a primary winding and a bias winding of a transformer. A secondary winding is similarly constructed using pins on another edge of the PLCC. A switched mode power supply integrated circuit chip is molded directly into the body of the PLCC nearer the primary winding conductor and chops current flowing in the primary winding according to a voltage derived from the current that results in the secondary winding.

An advantage of the present invention is that a switching power supply is provided that integrates both the transformer and IC in a switching power supply such that the transformer primary and secondary windings are molded in plastic with the chip IC.

Another advantage of the present invention is that an integrated transformer and IC for a switching power supply is provided that allows a higher number of turns on the transformer windings without necessitating the use of unusually small pin-to-pin spacings.

A further advantage of the present invention is that an integrated transformer and IC for a switching power supply is provided that allows a secondary winding of the transformer to be fully integrated.

Another advantage of the present invention is that an integrated transformer and IC for a switching power supply is provided that does not require extended printed circuit board to package pin lengths.

These and other objects and advantages of the present invention will no doubt become obvious to those of ordinary skill in the art after having read the following detailed description of the preferred embodiments which are illustrated in the various drawing figures.

IN THE DRAWINGS

FIG. 1 is a schematic diagram of a prior art power supply that uses a sixty hertz transformer with a linear regulator;

FIG. 2 is a schematic diagram of a prior art power supply that uses a high frequency transformer and a pulse width modulated (PWM) switching control;

FIG. 3 is a perspective view of a dual-in-line IC package embodiment of the present invention for sandwiching between ferrite cores and mounting to a printed circuit board;

FIGS. 4A, 4B, and 4C are cross-sectional, top, and side views, respectively, of the embodiment of FIG. 3 and illustrate in particular the placement of the regulator chip within the package and its relationship to the leadframe and traces on the PCB. The cross-section of FIG. 4A is taken along the line 4A—4A of FIG. 4B;

FIG. 5 illustrates an alternative embodiment of the present invention which utilizes an inverted U-shaped insulated copper foil;

FIG. 6 shows a cut-away view of a power converter assembly embodiment of the present invention molded into the plug portion of an AC power cord;

FIGS. 7A and 7B are top and cross-sectional views respectively, of an alternative embodiment of the present invention that has the magnetic cores lying flat against a PC board. The cross-section of FIG. 7B has been taken along the line 7B—7B of FIG. 7A;

FIG. 8A is a perspective view of a plastic quad packaged switching power supply embodiment of the present invention as seen from a side that attaches to printed circuit board;

FIG. 8B is a top view of the quad packaged switching power supply of FIG. 8A;

FIG. 8C is a cross-sectional view of the quad packaged switching power supply of FIG. 8A taken along the lines 8C—8C in FIG. 8B;

FIG. 9A is a schematic representation of the lead frame wiring within the quad packaged switching powers supply of FIG. 8A;

FIG. 9B shows a portion of the lead frame wiring of FIG. 9A with a spiral wound secondary winding;

FIG. 10 is a simplified schematic diagram of a complete line-operated switching power supply with an isolated low-voltage DC output and includes the quad packaged switching power supply of FIG. 8A;

FIG. 11 shows the internal connections of the quad packaged switching power supply of FIG. 8A superimposed over a modified eighty-lead surface mount plastic flat pack; and FIG. 12 shows the external connections to the quad packaged switching power supply of FIG. 8A on a typical printed circuit board substrate that have been superimposed over modified the eighty-lead surface mount plastic flat pack shown in FIG. 11.

DETAILED DESCRIPTION OF THE PREFERRED EMBODIMENT

In FIG. 3, a system 10 comprises a ferrite U-core 12, an IC package 14, a ferrite I-core 16, a printed circuit board (PCB) 18 having a plurality of traces 20 on one side, a regulator chip 22, and a leadframe 24 of which the external portion visible on one side of IC package 14 is shown in FIG. 3. Regulator chip can alternatively be placed outside IC package 14 in a package of its own and mounted on PCB 18 proximate to leadframe 24. Traces 20 are on the bottom of PCB 18 and cannot be clearly shown in the perspective view of FIG. 3, so the reader is referred to FIGS. 4A and 4C. The connection ends of leadframe 24 can either have pins shaped for through-hole conventional mounting or bent surface mount technology (SMT) leads. The primary reasons to choose one type of mounting over the other are controlled by factors that are relatively unimportant to the functioning of the present invention and such choices are routinely made by those skilled in the art. The ferrite I-core and U-core are magnetic structural pieces having the respective "I" and "U" shapes, and are preferably high frequency types. The core materials are readily available from a number of suppliers, such as TDK and Siemens. Particular shapes and sizes may have to be custom made. In the preferred embodiment, one MHz cores are used and the U-core 12 is placed on the bottom so that leadframe 24 drops into a small well. The U-core 12 and I-core 16 can be swapped. IC package 14 is mounted on PCB 18 over ferrite U-core 12 that has been previously attached to the PCB 18. In a preferred embodiment, PCB 18 is a single-sided board having through-holes that need not be plated. (Plated through-holes in PCBs increase manufacturing costs.) A "one-sided" or "single-sided" PCB means the PCB has conductive traces on only one of its sides. Single-sided printed circuit boards are generally less expensive than those having multiple layers of interconnect, and so are preferred because lower cost is a principal goal of those who are expected to employ the present invention. The ferrite I-core 16 is mounted over the assembled components to complete a magnetic path.

As illustrated in FIGS. 4A, 4B, and 4C, prior to mounting I-core 16, a pre-formed insulated wire 26 is inserted to complete a secondary winding of a step-down transformer. Chip 22 and wire 26 are preferably at opposite ends from one another. In the preferred embodiment, pre-formed wire 26 is actually one of the wire leads of an axial-lead rectifier. Wire 26 acts as the transformer secondary, and is protected from shorts by an insulated sleeving 27 (e.g., wiring spaghetti). Alternatively, the secondary winding can be part of leadframe 24. However, using wire 26 insulated by sleeve 27 may be necessary to meet the requirements of electrical safety testing labs, such as Underwriters Laboratories (UL) for off-line applications. The primary and bias windings of the transformer thus created is formed from the combination and physical placement of the leadframe 24 and the plurality of conductive traces 20 on the PCB 18. The leadframe 24 has a chip mounting pad that is offset from the center so that regulator chip 22 can be mounted at one end of the leadframe 24. In this way, the remaining length of the leadframe 24 can be dedicated to forming a part of the primary and bias windings. The body of IC package 14 takes its final shape when leadframe 24 is encapsulated with an insulating material 28, such as plastic, after regulator IC 22 has been positioned within IC package 14. Additionally, in order to provide space for the high frequency ferrite core underneath the IC package 14, either the leads may be cut slightly longer than usual, or the encapsulating plastic may be made slightly thinner than usual. There may be a gap 28 of material approximating the permeability of air between the I-core 16 and U-core 12 to adjust the magnetic properties of the resulting transformer. The typical number of turns in the primary winding of the present invention is ten to twenty and bias winding is three to four. In the secondary winding, one to two turns is typical.

The number of primary and bias winding turns can be programmed by manipulating the number of leadframe 24 connections to conductive traces 20 on PCB 18. Fewer turns obviously requires the use of less material and space. However, a lower number of turns means that higher switching frequencies are required to achieve the same power supply electrical performance. A lower number of turns also reduces the value of equivalent loss resistance across the winding due to the relatively high conductivity of ferrite cores. This effect alone limits the number of turns to no less than ten for currently available high frequency core material.

For lower leakage inductance, an I-core 30 (similar to I-core 16) and an inverted U-shaped insulated copper foil 32 cover an entire chip, as shown in FIG. 5. The foil 32 itself reduces the leakage inductance. This embodiment, however, requires the use of a surface mounted chip 34 (as opposed to a DIP IC), a U-core 36, a thin insulator 38, and a two-sided PCB 40. In this embodiment, the two-sided PCB 40 would provide one layer, the top side, for programming the number of primary winding turns, and the second layer, the bottom side, to complete the circuit for the secondary. Ferrite cores 30, 36 are used to provide the magnetic pathway. The thin material of insulator 38 is placed between the conductive traces on the top of the PCB 40 and ferrite U-core 36.

The small size of the AC adaptor of the present invention provides the opportunity to mold the assembly into the plug portion of an AC power cord. This market-enhancing product feature could be achieved using well-known plastic molding techniques, once the structural configuration of the present invention has been fabricated.

An example of this application of the present invention is shown in FIG. 6. An AC power cord, designated generally by reference numeral 50, is shown with part of the plug portion cut-away.

In operation, AC power is applied to a pair of prongs 52, which extend outward from an insulated plug portion 54. Within the plug portion 54, AC power is electrically coupled to an AC adaptor 58 assembled by the method of the present invention. The DC output of AC adaptor 58 is electrically coupled to a pair of conductive leads 60 which are embedded within an insulator 62.

FIGS. 7A and 7B illustrate an alternative embodiment of the present invention, an AC adaptor 70 that has a magnetic core 72 that lies flat against a PC board 74. The advantage of AC adaptor 70 is that assembly is simplified, since the magnetic core 72 can be a single piece that is simply glued down to the PC board 74 before a DIP package 76 containing several transformer windings and a semiconductor chip, as described above, is soldered in. In applications that allow a non-isolated secondary winding or lower level of isolation between primary and secondary (low voltage DC-to-DC converting), both the primary and secondary windings can be contained in DIP package 76. This technique allows the secondary wire, such as wire 26 and sleeving 27 in FIG. 4B, to be eliminated. A regulator chip 78 can either be disposed within DIP package 76 or mounted on PC board 74 proximate to a lead frame 80. FIGS. 7A and 7B show the regulator chip 78 within DIP package 76 here merely for purposes of illustration of an acceptable location. Both a secondary and a primary winding are contained in leadframe 80. A plurality of connections 82 complete the primary coil comprised of lead frame 80.

An alternative embodiment of the present invention is illustrated in FIGS. 8A–8C. A quad in-line packaged switching power supply 100 comprises a molded plastic package 102 that is flat and rectangular in shape and has a pair of rectangular holes 104 and 106 and a channel 108 that permit a U-core ferrite section 110 to pass through package 102 to couple with an I-core ferrite section 112. A circular magnetic path is created when U-core 110 is capped by I-core 112. A material that approximates the permeability of air may alternatively be inserted at one or two places between the I-core 112 and U-core 110 to adjust the magnetic properties of the assembled core. A switching power supply integrated circuit (IC) chip 114 is molded into package 102. An alternative location 116 may be provided for chip 114, including a location outside the package and on the printed circuit board. A set of three rows of surface mount technology (SMT) pins 118–120 are provided for a primary and a bias transformer winding. A single row of SMT pins 121 are provided for a secondary transformer winding that is magnetically coupled to the primary transformer winding by U-core 110 and I-core 112.

FIG. 9A illustrates a leadframe wiring diagram for power supply assembly 100, which is intended to be mounted on a printed circuit board that has traces that complete an interconnection between pin row 118 and half of pin row 119 underneath U-core 110 to pin row 120 and the other half of pin row 119 such that a multiple turn primary and bias windings are completed. Similarly, half of pin row 121 is connected by the traces on the printed circuit board underneath U-core 110 to the other half of pin row 121 such that a single multiple turn secondary winding is completed. The plastic body of package 102 provides insulation between winding turns, between the secondary and primary windings, and between the chip 114 and both windings. A larger than usual spacing between pins in pin row 121 and the pins in both of pin rows 118 and 120 provides a minimum creepage distance that may be required to meet various government and testing laboratory standards in the world. FIG. 9A illustrates two separate conductors proximate to hole 106 that may be connected by patterned traces of a printed circuit board to form a single wire that winds around U-core 110.

In FIG. 9B, these conductors are formed into a single spiral and brought out to only two pins on pin row 121 with a bonding wire jumper. In such a case, the number of turns would be fixed, but the completion of the turns by printed circuit board traces would be unnecessary.

FIG. 10 illustrates a complete switching power supply system 130 that includes power supply assembly 100. System 130 further includes a fuse 132, a bridge configuration of rectifiers 134–137, a pair of chokes 138 and 140, a pair of filter capacitors 142 and 144, and a snubber network 146. An isolated five volt output is provided by a diode 148 and a filter capacity 150 that are coupled to the secondary transformer winding that is partially disposed in assembly 100 and a printed circuit board upon which system 130 is constructed using surface mount technology. An op-amp 152 compares the voltage output of the isolated five volt output section to a voltage reference ($V_{ref}$) and drives a light emitting diode (LED) 154 in response. The voltage output of the isolated five volt output section is a function of the current being induced from the primary winding into the secondary winding. Therefore, a feedback path is provided for controlling the chopping of current flowing through the primary winding by an IC (e.g., 114) within assembly 100. For isolation, this feedback path includes the light output of LED 154 which is optically coupled to the base of a photo-transistor 156. The emitter of photo-transistor 156 then is able to control assembly 100, e.g., by a single lead wire.

A non-isolated bias voltage output is provided by assigning some of the conductors in assembly 100 for the primary winding to serve as a second primary or a bias winding which can also provide a non-isolated secondary output. A diode 158 rectifies the current and a capacitor 160 does the filtering. For example, a nominal output voltage of 7.5 volts may be produced by such a section. An AC line voltage input of 110–220 volts may be input to power supply 130. The voltages cited here are typical, but not limiting of the invention. Other input and output voltage combinations are feasible and may be desirable, depending on the application.

FIG. 11 shows the internal connections of assembly 100 superimposed over a modified eighty-lead surface mount plastic flat pack.

FIG. 12 shows the external connections to assembly 100 on a typical printed circuit board substrate that have been superimposed over modified eighty-lead surface mount plastic flat pack shown in FIG. 11.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. An electronic power supply assembly, comprising:

a four-sided flat package of insulating material having a first hole and a second hole from a top surface to a bottom surface and separated from one another that provide for a magnetic core disposed within said first and second holes;

a first through third row of connection pins mounted along a first through a third edge of the four-sided flat package;

a fourth row of connection pins mounted along a fourth edge of the four-sided flat package;

a first plurality of individual parallel conductors enclosed within the four-sided flat package and each having an electrically-isolated segment that passes through an area between said first and second holes in the four-sided flat package and that electrically connect to respective pins of the first through third row of connection pins providing for the external connection of said segments with the first through third row of connection pins in a first single continuous spiral coil axial to said first and second holes; and a second plurality of conductors enclosed within the four-sided flat package and having at least one electrically-isolated segment that passes through said area between said first and second holes in the four-sided flat package and that electrically connect to respective pins of the fourth row of connection pins providing for the external connection of said segments with the fourth row of connection pins in a second single continuous spiral coil axial to said first and second holes.

2. The assembly of claim 1, further comprising:

a channel in said bottom surface of the four-sided flat package that extends said first hole to said second hole providing for a nesting of said magnetic core.

3. The assembly of claim 1, further comprising:

a ferrite U-core having first and second legs disposed within said first hole and said second hole and encircled between by said first and second single continuous spiral coils; and a ferrite I-core having first and second ends in contact with said first and second legs on said ferrite U-core and providing for a closed magnetic path to transformer-couple said first and second single continuous spiral coils.

4. The assembly of claim 1, further comprising:

a switching power supply integrated circuit (IC) chip enclosed within the four-sided flat package and conflicted for controlling a first current flow in said first plurality of conductors based on a voltage derived from a second current flow in said second plurality of conductors.

5. The assembly of claim 1, wherein:

the first through third rows of connection pins comprise surface mount technology construction and are provided for mounting the whole of the assembly to a printed circuit board that includes traces in a pattern that connects said individual conductors in the first plurality of conductors into said first single continuous spiral coil to form a primary transformer winding.

6. The assembly of claim 1, wherein:

the fourth row of connection pins comprise surface mount technology construction and are provided for mounting the whole assembly to a printed circuit board that includes traces in a pattern that connects said individual conductors in the second plurality of conductors into said second single continuous spiral coil to form a secondary transformer winding.

7. The assembly of claim 1, wherein:

the first through third rows of connection pins comprise surface mount technology construction and are provided for mounting the whole assembly to a printed circuit board that includes traces in a pattern that connects said individual conductors in the first plurality of conductors into said first single continuous spiral coil to form a primary transformer winding; and the fourth row of connection pins comprise surface mount technology construction and are provided for mounting the whole assembly to a printed circuit board that includes traces in a pattern that connects said individual conductors in the second plurality of conductors into said second single continuous spiral coil to form a secondary transformer winding.

8. A switching power supply assembly, comprising:

a four-sided flat package of insulating material having a first hole and a second hole from a top surface to a bottom surface and separated from one another that provide for a magnetic core disposed within said first and second holes;

a channel in said bottom surface of the four-sided flat package that connects said first hole to said second hole;

a ferrite U-core having first and second legs that pass through said first hole and said second hole of the four-sided flat package from said bottom surface and nests in the channel;

a ferrite I-core having first and second ends that meet said first and second legs on said ferrite U-core and that completes a magnetic path;

a first through third row of connection pins mounted along a first through a third edge of the four-sided flat package;

a fourth row of connection pins mounted along a fourth edge of the four-sided flat package;

a first plurality of individual parallel conductors enclosed within the four-sided flat package and each having an electrically-isolated segment that passes through an area between said first and second holes in the four-sided flat package and that electrically connect to respective pins of the first through third row of connection pins providing for the external connection of said segments with the first through third row of connection pins in a first single continuous spiral coil axial to said first and second holes;

a second plurality of conductors enclosed within the four-sided flat package and having at least one electrically-isolated segment that passes through said area between said first and second holes in the four-sided flat package and that electrically connect to respective pins of the fourth row of connection pins providing for the external connection of said segments with the fourth row of connection pins in a second single continuous spiral coil axial to said first and second holes; and a switching power supply integrated circuit (IC) chip for controlling a first current flow in said first plurality of conductors based on a voltage derived from a second current flow in said second plurality of conductors.

9. The assembly of claim 8, wherein:

the first through third rows of connection pins comprise surface mount technology construction and are provided for mounting the whole assembly to a printed circuit board that includes traces in a pattern that connects said individual conductors in the first plurality of conductors into said first single continuous spiral coil to form a primary transformer winding; and the fourth row of connection pins comprise surface mount technology construction and are provided for mounting the whole assembly to a printed circuit board that includes traces in a pattern that connects said individual conductors in the second plurality of conductors into said second single continuous spiral coil to form a secondary transformer winding.

10. A transformer, comprising:

a four-sided flat plastic package with a plurality of connector pins arranged in four rows in first and second sets in respective separate halves of the plastic package for connection to a printed circuit board;

a plurality of individual conductor segments each connected at opposite ends to respective ones of said first and second sets of said plurality of connector pins; and a ferrite magnetic core forming a loop that orthogonally encircles said plurality of individual conductor segments;

wherein a first portion of the plurality of individual conductor segments provides for the completion of a primary transformer winding that electrically spirals around the ferrite magnetic core when said connector pins are respectively interconnected by wires on said printed circuit board, and a second portion of the plurality of individual conductor segments provides for the completion of a secondary transformer winding that electrically spirals around the ferrite magnetic core when said connector pins are respectively interconnected by wires on said printed circuit board and said primary transformer winding is magnetically coupled to said secondary transformer winding by the ferrite magnetic core.

11. The transformer of claim 10, further comprising:

a switching transistor disposed in the plastic package and connected to switch electrical current in said plurality of individual conductor segments.

* * * * *